(12) United States Patent
Jo et al.

(10) Patent No.: US 9,238,363 B2
(45) Date of Patent: Jan. 19, 2016

(54) ELECTRONIC COMPONENT MOVING MECHANISM AND PRINTER

(71) Applicant: Brother Kogyo Kabushiki Kaisha, Nagoya-shi, Aichi-ken (JP)

(72) Inventors: Hidenori Jo, Nagoya (JP); Kenji Kurita, Kariya (JP); Takamine Hokazono, Kasugai (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 14/662,304

(22) Filed: Mar. 19, 2015

(65) Prior Publication Data

US 2015/0306873 A1    Oct. 29, 2015

(30) Foreign Application Priority Data

Apr. 25, 2014   (JP) ................. 2014-091901

(51) Int. Cl.
  *B41J 2/14*   (2006.01)
  *H05K 1/02*   (2006.01)
(52) U.S. Cl.
  CPC . *B41J 2/14* (2013.01); *H05K 1/028* (2013.01); *B41J 2002/14491* (2013.01)
(58) Field of Classification Search
  CPC ...... B41J 19/202; B41J 29/02; B41J 2/17526; B41J 2/1752; B41J 25/304
  USPC .............. 347/37, 50, 104, 108, 109
  See application file for complete search history.

(56) References Cited

U.S. PATENT DOCUMENTS

| | | | | |
|---|---|---|---|---|
| 6,644,780 | B2 * | 11/2003 | Lodal | B41J 25/304 347/37 |
| 7,101,019 | B2 * | 9/2006 | Inoue | B41J 2/1752 347/37 |
| 7,815,288 | B2 * | 10/2010 | Inamura | B41J 29/02 347/20 |

FOREIGN PATENT DOCUMENTS

| JP | H06-180824 A | 6/1994 |
|---|---|---|
| JP | 2002-240390 A | 8/2002 |
| JP | 2006-235349 A | 9/2006 |

* cited by examiner

*Primary Examiner* — An Do
(74) *Attorney, Agent, or Firm* — Banner & Witcoff, Ltd.

(57) ABSTRACT

An electronic component moving mechanism includes a holding portion holding an electronic component, a position changing portion, a first wiring portion, a second wiring portion, a third wiring portion, and a connection line. The third wiring portion protrudes from a leading end portion of the second wiring portion toward another side in the first direction. The connection line includes a first bent portion and a second bent portion in a case where the position of the holding portion is changed to a position on the other side. The first bent portion is folded back from the other side to the one side along the leading end portion of the third wiring portion, and the second bent portion is folded back from the one side to the other side between the first bent portion and a second end portion connecting the connection line and an external circuit.

8 Claims, 8 Drawing Sheets

ELECTRONIC COMPONENT MOVING MECHANISM AND PRINTER

CROSS-REFERENCE TO RELATED APPLICATION

This application claims priority to Japanese Patent Application No. 2014-091901 filed Apr. 25, 2014, the content of which is hereby incorporated herein by reference.

The present disclosure relates to an electronic component moving mechanism and a printer that are capable of moving an arrangement position of an electronic component that is connected to a connection line.

BACKGROUND

An electronic device is known that is provided with a moving mechanism that moves a holding portion that holds an electronic component and thus changes an arrangement position of the electronic component. As an example of the electronic device, a printer is known that includes a carriage mechanism that causes a carriage, on which a print head is mounted, to move along a platen. The print head of the printer is connected to one end of a flexible printed circuit board (FPC), and is electrically connected to a control circuit unit via the FPC. The FPC extends substantially laterally from the print head, and is placed on an FPC supporting portion that protrudes more than a mounting surface of the print head of the carriage. The FPC bends, passes through below the carriage, and is connected to the control circuit unit. Since the FPC is placed on the FPC supporting portion, a relatively large arc is formed in a portion that is bent (a bent portion). Therefore, when the carriage mechanism moves the carriage, a load due to flexing resistance is unlikely to be applied to the FPC, and the FPC is unlikely to become disconnected.

In the above-described printer, in a movement direction of the carriage, the bent portion is positioned on an opposite side to the control circuit unit with respect to the carriage. Therefore, the carriage does not move across the bent portion. However, even when the carriage has moved to a position that is most distant from the control circuit unit, it is necessary to secure a location where the bent portion of the FPC is arranged to the side of the carriage. As a result, it is difficult to achieve a reduction in space for an arrangement structure. To address this, for example, when the FPC is configured to be pulled out below the carriage, a bent portion is formed in the FPC when the carriage has moved to the side where the carriage is closer to the control circuit unit. Then, when the carriage has moved to the side where the carriage is separated from the control circuit unit, the carriage moves across the bent portion. When the carriage has moved to a position that is separated from the control circuit unit, the FPC moves toward the control circuit unit from below the carriage and a state is formed in which the bending of the bent portion is stretched out. Therefore, there is no need to secure a location to arrange the bent portion to the side of the carriage, and it is possible to achieve a reduction in space for the arrangement structure.

SUMMARY

However, when the carriage has moved to the position where the carriage is separated from the control circuit unit, a surface of a portion of the FPC that has been pulled out from the holding portion (the surface being directed to the control circuit unit side in the movement direction of the carriage) is directed to the upper side. Further, when the carriage has moved to a position where the carriage is closer to the control circuit unit, a surface of the portion of the FPC that has been pulled out from the holding portion (the surface being on the opposite side to the surface directed to the control circuit unit side in the movement direction of the carriage) is directed to the upper side. That is, every time the carriage moves across the bent portion, in the FPC that has been pulled out from the holding portion, the direction in which the bent portion is bent is reversed, and there is a possibility of disconnection.

It is an object of the present disclosure to provide an electronic component moving mechanism and a printer that are capable of achieving a reduction in space for an arrangement structure and capable of suppressing disconnection of a connection line even when an electronic component is moved.

Exemplary embodiments provide an electronic component moving mechanism that includes an electronic component, a holding portion, a position changing portion, a first wiring portion, a second wiring portion, a third wiring portion, and a connection line. The holding portion is configured to hold the electronic component. The position changing portion is configured to guide movement of the holding portion and to change a position of the holding portion at least in a predetermined first direction. The first wiring portion is provided on an edge portion of the holding portion on one side in a second direction that intersects the first direction, and protrudes from the edge portion toward the one side in the second direction. The first wiring portion has a first surface on a side portion and has a second surface on a leading end portion. The first surface intersects the first direction. The second surface intersects the second direction. The second wiring portion is provided in a position further to one side in the first direction than a position where the first wiring portion is provided on the edge portion, and protrudes from the edge portion toward the one side in the second direction. The second wiring portion has a leading end portion that is positioned further to the one side in the second direction than the leading end portion of the first wiring portion, and has a third surface on a side portion. The third surface faces the first surface such that a first gap is formed between the third surface and the first surface. The third wiring portion protrudes from the leading end portion of the second wiring portion toward another side in the first direction, and has a leading end portion that is positioned further to the other side in the first direction than the first surface. The third wiring portion has a fourth surface on a side portion. The fourth surface faces the second surface such that a second gap is formed between the fourth surface and the second surface. The connection line has a first end portion that is connected to the electronic component, and is wired passing through the first gap and the second gap. The connection line has a second end portion that is connected to an external circuit in a position further to the other side in the first direction than a change range within which the position changing portion is capable of changing the position of the holding portion in the first direction. The connection line includes at least two bent portions that include a first bent portion and a second bent portion in a case where the position of the holding portion is changed to a position on the other side in the first direction. The first bent portion is folded back from the other side to the one side in the first direction along the leading end portion of the third wiring portion. The second bent portion is folded back from the one side to the other side in the first direction between the first bent portion and the second end portion.

Exemplary embodiments provide a printer that includes a printing portion, a lid portion, a first roller, an electronic component moving mechanism, and a peeling portion. The printing portion is configured to perform printing on a label.

The lid portion is configured to be capable of opening and closing a housing portion that houses a roll, around which a base sheet to which the label is adhered is wound. The first roller is provided on the lid portion and is configured to rotate around a rotating shaft that extends in a third direction that intersects a first direction and a second direction. The second direction intersects the first direction. The electronic component moving mechanism includes an electronic component, a holding portion, a second roller, a position changing portion, a first wiring portion, a second wiring portion, a third wiring portion, and a connection line. The holding portion is configured to hold the electronic component and to be movable at least in the first direction. The second roller is provided further to one side in the first direction than the holding portion, and movement of which is guided together with the holding portion. The second roller is configured to rotate around a rotating shaft that extends in the third direction, and is configured to feed the base sheet such that the base sheet is clamped between the first roller and the second roller. The position changing portion is configured to guide the movement of the holding portion and the second roller, and is configured to change the position of the holding portion and of the second roller between a first position and a second position. The first position is a position where the holding portion and the second roller have been moved to another side in the first direction, and is a position where the second roller is separated from the first roller. The second position is a position where the holding portion and the second roller have been moved to the one side in the first direction, and is a position where the second roller comes into contact with the first roller. The first wiring portion is provided on an edge portion of the holding portion on one side in the second direction, and protrudes from the edge portion toward the one side in the second direction. The first wiring portion has a first surface on a side portion and has a second surface on a leading end portion. The first surface intersects the first direction. The second surface intersects the second direction. The second wiring portion is provided in a position further to the one side in the first direction than a position where the first wiring portion is provided on the edge portion, and protrudes from the edge portion toward the one side in the second direction. The second wiring portion has a leading end portion that is positioned further to the one side in the second direction than the leading end portion of the first wiring portion. The second wiring portion has a third surface on a side portion. The third surface faces the first surface such that a first gap is formed between the third surface and the first surface. The third wiring portion protrudes from the leading end portion of the second wiring portion toward the other side in the first direction, and has a leading end portion that is positioned further to the other side in the first direction than the first surface. The third wiring portion has a fourth surface on a side portion. The fourth surface faces the second surface such that a second gap is formed between the fourth surface and the second surface. The connection line has a first end portion that is connected to the electronic component, and is wired passing through the first gap and the second gap. The connection line has a second end portion that is connected to an external circuit in a position further to the other side in the first direction than a change range within which the position changing portion is capable of changing the position of the holding portion in the first direction. The connection line includes at least two bent portions that include a first bent portion and a second bent portion in a case where the position of the holding portion is changed to a position on the other side in the first direction. The first bent portion is folded back from the other side to the one side in the first direction along the leading end portion of the third wiring portion. The second bent portion is folded back from the one side to the other side in the first direction between the first bent portion and the second end portion. The peeling portion is disposed between the second roller and the holding portion, and that is configured to be capable of peeling off the label from the base sheet when the first roller and the second roller feed the base sheet.

BRIEF DESCRIPTION OF THE DRAWINGS

Embodiments will be described below in detail with reference to the accompanying drawings in which.

DETAILED DESCRIPTION

Figure 1:
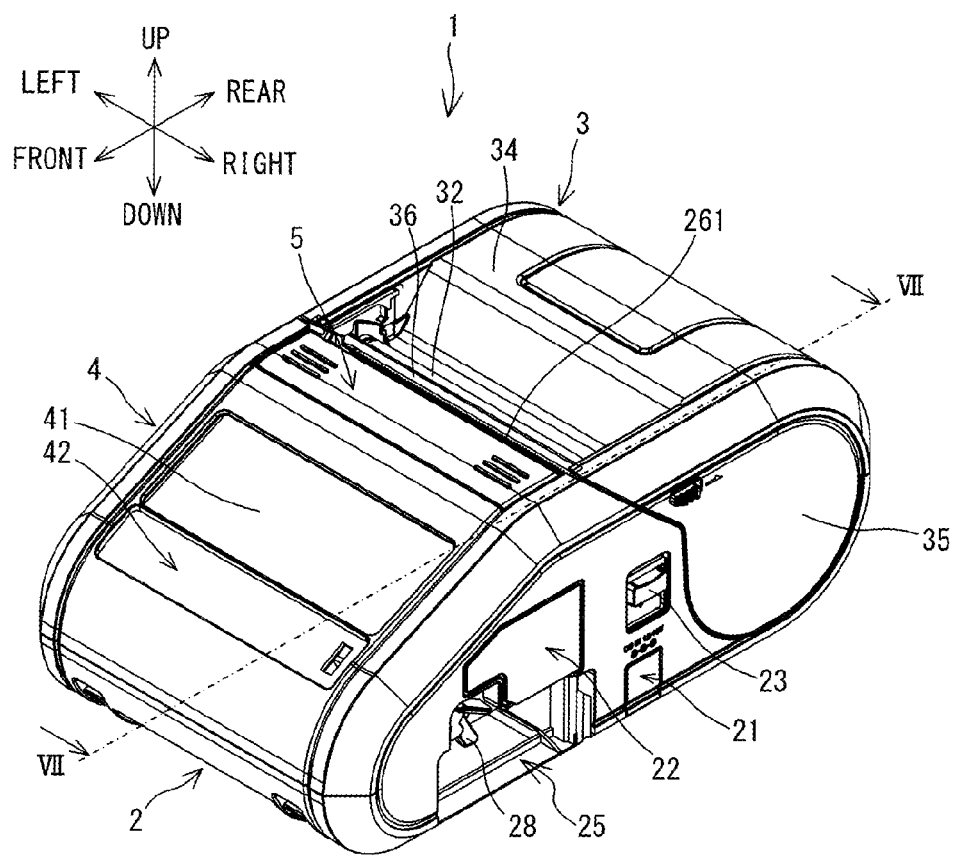
FIG. 1 is a perspective view of a printer 1 when a rear cover 3 is closed.

Hereinafter, an embodiment of the present disclosure will be explained with reference to the drawings. The drawings that are referred to are used to explain technological features that can be adopted by the present disclosure. Device structures and the like shown in the drawings are merely explanatory examples, and are not intended to limit the present disclosure only to these examples. A printer 1 can be connected to an external terminal (not shown in the drawings) via a USB cable, Bluetooth (registered trademark), a wireless LAN or the like. Examples of the external terminal include a general-purpose personal computer (PC), a mobile terminal, a tablet terminal and the like. The printer 1 can print characters, graphics and the like on a print medium, based on print data that is received from the external terminal. The print medium is a label sheet, for example. In the present embodiment, a roll-shaped label sheet (hereinafter referred to as a "label tape"), around which is wound a base sheet to which a heat-sensitive label is adhered, is used as an example of the print medium. In the explanation below, the lower right side, the upper left side, the upper right side, the lower left side, the upper side and the lower side of FIG. 1 are respectively defined as the right side, the left side, the rear side, the front side, the upper side and the lower side of the printer 1. The definition of the directions in FIG. 1 is applied correspondingly to the explanation of FIG. 2 onward.

An overview of the printer 1 will be explained with reference to FIG. 1 and FIG. 2. The printer 1 is provided with a housing 2 having a box shape whose upper portion is open. A front section of the open upper portion of the housing 2 is covered by a front cover 4, and a rear section of the open upper portion is covered by a rear cover 3. Left and right side portions of a rear section of the housing 2 are open, and the open portions are covered by the rear cover 3 in a similar manner to the upper portion. The housing 2 has a substantially rectangular shape in a front view and a plan view, and corner portions are chamfered. When the front cover 4 and the rear cover 3 have been attached to the housing 2, the housing 2 has a substantially oval shape (refer to FIG. 7) in a side view, and the front side of the upper portion is inclined toward the front. The front cover 4 is provided such that it mainly covers the inclined portion. The front cover 4 is fixed to the housing 2. When the front cover 4 is assembled to the housing 2, a display portion 41 and an operation portion 42 are provided on an inclined surface that is inclined downward toward the front. The display portion 41 is a rectangular liquid crystal screen that is long in the left-right direction, and displays various types of information, such as a drive state of the printer 1, settings, messages and the like. The operation portion 42 is a capacitance switch, for example, and receives input of a command to the printer 1. The operation portion 42 is provided in a rectangular area that extends in the left-right direction along the lower edge of the display portion 41. The rear cover 3 will be explained later.

The housing 2 internally houses a control board 8, a printing portion 262 (refer to FIG. 7), a drive portion (not shown in the drawings) and the like. The control board 8 is housed substantially in a central position in the up-down direction, in a front section in the front-rear direction of the housing 2, and is arranged below the front cover 4. The control board 8 is provided with a CPU (not shown in the drawings) that performs overall control of the printer 1. The control board 8 is provided with a connector 81. The connector 81 connects an end portion 14 of a flexible printed circuit board (FPC) 11 (which will be described later) to the control board 8. The printing portion 262 is a line thermal head that can perform printing on a heat-sensitive label. The printing portion 262 is provided substantially in a central position in the front-rear direction in the upper portion of the housing 2. The printing portion 262 is exposed to the inside of a tape housing portion 24 that will be described later, and faces a platen roller 32 (which will be described later) of the rear cover 3 from the front side of the platen roller 32 in a state in which the rear cover 3 is closed. The drive portion is a motor to feed the heat-sensitive label. The drive portion is provided substantially in a central position in the front-rear direction in a lower portion of the housing 2. When the rear cover 3 is closed, the drive portion transmits a driving force to the platen roller 32 via a gear (not shown in the drawings).

A right side portion of the housing 2 is provided with a power receiving portion 21, a USB interface (I/F) 22, a lever 23, a battery housing portion 25, a fixing portion 28 and the like. The power receiving portion 21 is provided with a terminal (not shown in the drawings) into which a plug of an AC adapter is inserted, and an outlet of the terminal is protected by a flexible cover member, such as a rubber member. Similarly, the USB I/F 22 is provided with a plurality of terminals (not shown in the drawings) into which a connector of a USB cable is inserted, and outlets of the terminals are protected by flexible cover members. The printer 1 can perform communication with an external terminal via the USB I/F 22. The battery housing portion 25 houses a case (not shown in the drawings) that can house a battery. The printer 1 is driven by electric power that is supplied from the AC adapter connected to the power receiving portion 21, or by electric power that is supplied from the battery housed in the battery housing portion 25. Note that the printer 1 can use a primary battery and a secondary battery as the battery. The printer 1 can charge the secondary battery by the electric power supplied from the power receiving portion 21. The fixing portion 28 fixes the case of the battery housed in the battery housing portion 25 to the housing 2. The lever 23 releases hooks 27 (which will be described later) that maintain the rear cover 3 in a closed state.

The rear section of the housing 2 is formed as the tape housing portion 24 in which the label tape (not shown in the drawings) is housed. An upper portion of the tape housing portion 24 and left and right side portions of the tape housing portion 24 are open. The rear cover 3 covers the upper portion and the left and right side portions of the tape housing portion 24, and protects the label tape housed in the tape housing portion 24. A holder 9 is provided inside the tape housing portion 24 of the housing 2. The holder 9 holds the label tape. The printing portion 262 (refer to FIG. 7) is provided on the upper end of a wall portion on the front side of the tape housing portion 24 such that the printing portion 262 extends in the left-right direction and is exposed to the inside of the tape housing portion 24. A cutting portion 261 that extends in the left-right direction is provided on the upper edge of the printing portion 262. The cutting portion 261 can cut off a printed section of the label tape. The base sheet, to which the heat-sensitive label printed by the printer 1 has been adhered, passes through a gap (hereinafter referred to as a "discharge port" 15 (refer to FIG. 7)) between the cutting portion 261 and a separation plate 36 (which will be described later), and is discharged to the outside. The hooks 27 are provided as a pair on the upper front side of the tape housing portion 24, in the vicinity of the left and right side portions of the tape housing portion 24. The rear cover 3 is provided with a pair of cylindrical-shaped support cylinders 33 that rotatably support a rotating shaft of the platen roller 32. The hooks 27 are engaged with the support cylinders 33 and maintain the rear cover 3 in the closed state. When the lever 23 moves downward in response to an operation, the upper end side of the hooks 27 swings to the rear, and the engagement between the hooks 27 and the support cylinders 33 is released.

The rear cover 3 is provided with a top wall portion 34 and a pair of side wall portions 35. When the tape housing portion 24 is closed, the top wall portion 34 covers the upper portion of the tape housing portion 24 and the pair of side wall portions 35 cover the left and right side portions of the tape housing portion 24. In the explanation below, the closed state of the rear cover 3 (refer to FIG. 1) is taken as a reference for orientation when the structure of the rear cover 3 is explained. The top wall portion 34 is a plate shaped member having a substantially rectangular shape in a plan view. A section of the top wall 34 from substantially the center to the front in the front-rear direction is arranged such that the thickness direction is the up-down direction. A curved portion that is gently curved downward is formed on a section of the top wall portion 34 from substantially the center to a rear end portion in the front-rear direction. The pair of side wall portions 35 are plate shaped members that respectively stand from edge portions on both the left and right sides of the top wall portion 34 toward the inside of the curved portion of the top wall portion 34. Edge portions of the sections of the pair of side wall portions 35 that stand from the top wall portion 34 are each formed in an arc shape.

Mutually facing surfaces of the pair of side wall portions 35 and surfaces of the top wall portion 34 on which the pair of side wall portions 35 respectively stand are directed to the inside of the tape housing portion 24. The top wall portion 34 is provided with a pair of bearing portions 38 on the edge portion on the side where the curved portion is formed. Holes that penetrate in the left-right direction are respectively formed in the bearing portions 38. The pair of support cylinders 33 that support the rotating shaft of the platen roller 32 are fixed to the edge portion on the side that is opposite to the side where the curved portion of the top wall portion 34 is formed. Hereinafter, an end portion of the rear cover 3 on the side where the bearing portions 38 are provided on the top wall portion 34 is referred to as a "base end portion," and an end portion of the rear cover 3 on the side where the platen roller 32 is provided is referred to as a "free end portion." The housing 2 is provided with a pair of bearing portions 19 on the upper end of a wall portion on the rear side of the tape housing portion 24. Holes that penetrate in the left-right direction are respectively formed in the bearing portions 19. Axial rods 29 are inserted through the respective holes of the pair of bearing portions 19 of the housing 2 and the pair of bearing portions 38 of the rear cover 3. The axial rods 29 swingably support the free end portion with respect to the base end portion of the rear cover 3. When the rear cover 3 is opened, the free end portion of the rear cover 3 moves from the front to the rear while moving in an arc upward, and releases the tape housing portion 24. An urging member 31 is attached to each of the axial rods 29. The urging member 31 is a coil spring, for example. Both ends of the urging member 31 come into contact with an inner surface of the top wall portion 34 of the rear cover 3 and an inner surface of the tape housing portion 24 of the housing 2, respectively, and press the inner surfaces. The urging member 31 urges the rear cover 3 relatively with respect to the housing 2, from the state in which the tape housing portion 24 is closed by the rear cover 3 toward the state in which the tape housing portion 24 is opened.

The rotating shaft of the platen roller 32 that is supported by the free end portion of the rear cover 3 extends in the left-right direction. The left end of the rotating shaft of the platen roller 32 protrudes further to the left than the support cylinder 33 on the left side. A gear 37 is provided on the left end of the rotating shaft. When the rear cover 3 is closed, the gear 37 meshes with a gear (not shown in the drawings) that is connected to the drive portion provided inside the housing 2. When the rear cover 3 is closed, the hooks 27 of the tape housing portion 24 are engaged with the support cylinders 33, and maintain the closed state of the rear cover 3 while maintaining the state in which the platen roller 32 is connected to the drive portion via the gear 37. The printing portion 262 (refer to FIG. 7) is urged rearward by a spring-shaped urging member 263 (refer to FIG. 7) that is arranged to the front of the printing portion 262. When the rear cover 3 is closed, the printing portion 262 is maintained in a state in which it is pressed against the surface of the platen roller 32 that is positioned to the rear of the printing portion 262.

The rear cover 3 is provided with the separation plate 36 (refer to FIG. 7) above the platen roller 32. The separation plate 36 is a plate shaped member that extends in the left-right direction, and an upper portion of the separation plate 36 is curved in a mountain-shape when viewed in a cross section in the left-right direction. The separation plate 36 is fixed to the free end portion in a state in which an edge portion on the front side of the separation plate 36 is close to the surface of the platen roller 32. The printer 1 is provided with a peeling mechanism 5 in a position between the rear end of the front cover 4 and the free end portion of the rear cover 3 when the rear cover 3 is closed. The peeling mechanism 5 separates the label tape, which is discharged from the discharge port 15 in a state in which the printed heat-sensitive label is adhered to the base sheet, into the heat-sensitive label and the base sheet. The operation of the printer 1 can be switched between a "normal mode" and a "peeling mode." In the "normal mode,"
the printer 1 does not use the peeling mechanism 5 and discharges the heat-sensitive label to the outside in a state in which the heat-sensitive label is adhered to the base sheet. In the "peeling mode," the printer 1 uses the peeling mechanism 5 and discharges the heat-sensitive label to the outside while peeling off the heat-sensitive label from the base sheet.

Figure 3:
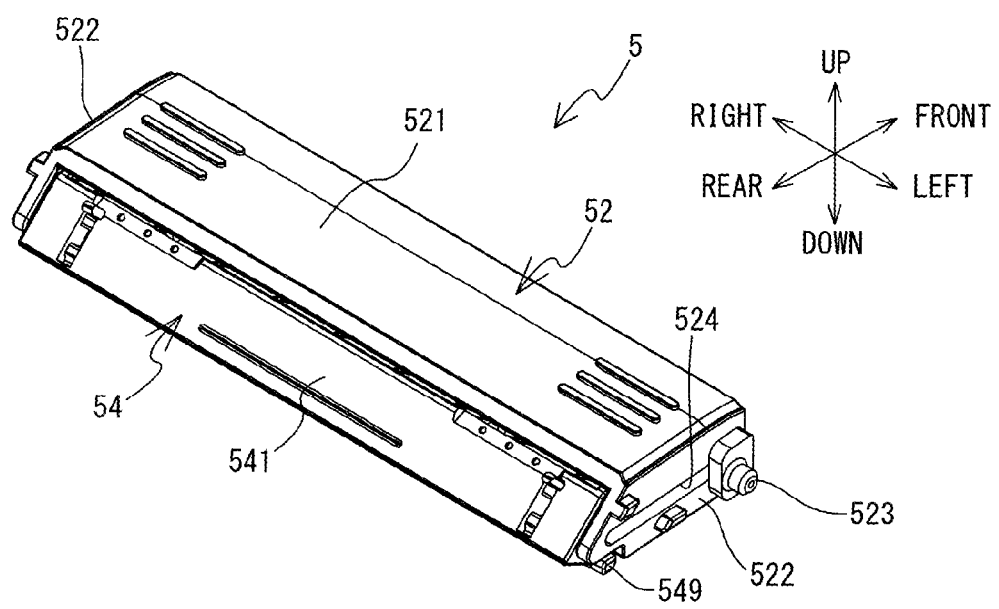
FIG. 3 is a perspective view of a peeling mechanism 5 in a housed state when viewed from the rear and the upper left side.
Figure 4:
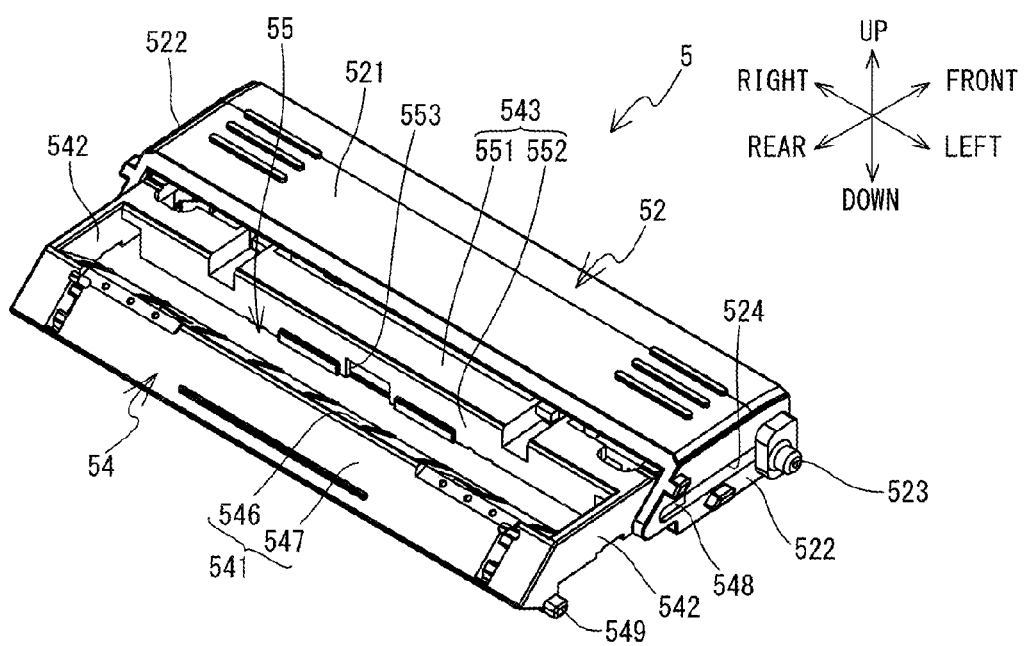
FIG. 4 is a perspective view of the peeling mechanism 5 in a protruding state when viewed from the rear and the upper left side.
Figure 5:
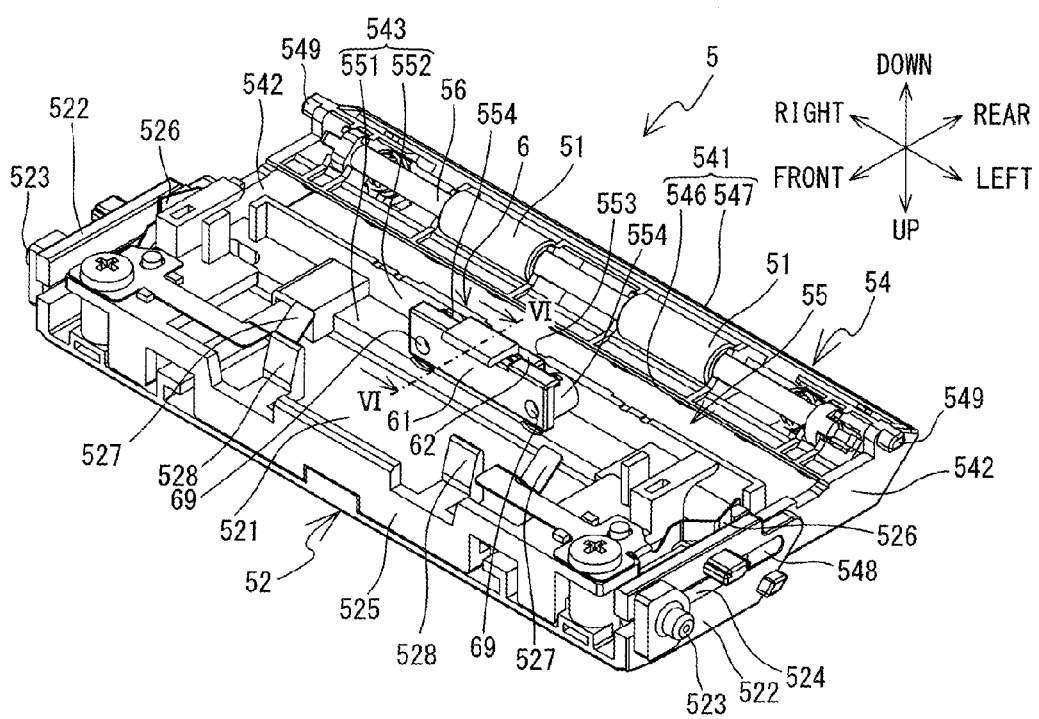
FIG. 5 is a perspective view of the peeling mechanism 5 in the protruding state when viewed from the front and the lower right side.

The peeling mechanism 5 will be explained in detail with reference to FIG. 3 to FIG. 6. As shown in FIG. 3 to FIG. 5, the peeling mechanism 5 has a substantially rectangular shape in a plan view and extends long in the left-right direction. The front side surface of the peeling mechanism 5 is orthogonal to the front-rear direction, and the rear side surface of the peeling mechanism 5 is inclined downward toward the rear. The peeling mechanism 5 is provided with a frame portion 52 and a separation portion 54. The separation portion 54 can move relative to the frame portion 52 in the front-rear direction (refer to FIG. 4).

The frame portion 52 forms an outer frame of the peeling mechanism 5. The frame portion 52 has a top plate portion 521 and a pair of side plate portions 522. The top plate portion 521 is a substantially rectangular plate shaped member in a plan view, and its thickness direction is the up-down direction. The top plate portion 521 extends in the left-right direction. The pair of side plate portions 522 are plate shaped members whose thickness direction is the left-right direction, and respectively extend downward from edge portions on both the left and right sides of the top plate portion 521. The pair of side plate portions 522 respectively extend in the front-rear direction, and have a trapezoidal shape in which an edge portion on the rear end side forms an oblique line. The side plate portion 522 on the left side has a front end portion that is provided with a columnar shaft portion 523 that protrudes leftward. Similarly, the side plate portion 522 on the right side has a front end portion that is provided with a columnar shaft portion 523 (refer to FIG. 5) that protrudes rightward. The pair of shaft portions 523 are respectively engaged with a pair of bearing portions 264 (refer to FIG. 2) that are provided on the upper portion of the housing 2. The bearing portions 264 are each formed in a groove shape that extends in the front-rear direction. The peeling mechanism 5 is supported such that it can move relative to the housing 2 in the front-rear direction and such that the rear end side of the peeling mechanism 5 can swing in the up-down direction.

In the explanation below, a state in which the peeling mechanism 5 has swung such that an upper surface of the top plate portion 521 is substantially horizontal (refer to FIG. 2) is taken as a reference for posture when the structure of the peeling mechanism 5 is explained. Elongated holes 524 that penetrate in the left-right direction and that extend in the front-rear direction are formed on the pair of side plate portions 522 of the frame portion 52, respectively. The elongated holes 524 extend from the vicinity of the front end of each of the pair of side plate portions 522 to the vicinity of the rear end. The elongated holes 524 guide the movement of the separation portion 54 in the front-rear direction.

In the peeling mode of the printer 1, the separation portion 54 peels off the heat-sensitive label from the base sheet of the label tape discharged from the discharge port 15, and temporarily holds the peeled-off heat-sensitive label. The separation portion 54 has a separation member 541, a pair of support members 542 and a holding member 543. The separation member 541 is a plate shaped member that extends in the left-right direction, and has a first plate body 546 that is inclined forward and downward and a second plate body 547 that is inclined rearward and downward. The upper side of the first plate body 546 and the upper side of the second plate body 547 are connected to each other, and a space to arrange two feed rollers 51 (refer to FIG. 5) is formed below the first plate body 546 and the second plate body 547. The feed rollers 51 are cylindrical rollers that extend in the left-right direction. The feed rollers 51 are fitted around an outer peripheral surface of a rotating shaft 56 (refer to FIG. 5) that extends in the left-right direction. The rotating shaft 56 is assembled into the space below the first plate body 546 and the second plate body 547 of the separation member 541 in a state in which the rotating shaft 56 is urged downward, and the feed rollers 51 are rotatably supported. The length of the separation member 541 in the left-right direction is slightly shorter than the length of the top plate portion 521 of the frame portion 52 in the left-right direction.

The pair of support members 542 have a thickness in the left-right direction, and are plate shaped members that respectively extend forward from both the left and right ends of the separation member 541. The length of the pair of support members 542 in the front-rear direction is substantially the same as the length of the pair of side plate portions 522 of the frame portion 52 in the front-rear direction. The length of the pair of support members 542 in the up-down direction is shorter than the length of the pair of side plate portions 522 of the frame portion 52 in the up-down direction. The pair of support members 542 are respectively provided with protruding portions 548 that protrude outward in the left-right direction, on front end portions of outer side surfaces of the support members 542. The respective protruding portions 548 are engaged with the elongated holes 524 provided in the pair of side plate portions 522 of the frame portion 52, from the inside of the frame portion 52. The two protruding portions 548 are respectively guided by the elongated holes 524, and can move in the front-rear direction. The pair of support members 542 are respectively provided with protruding portions 549 that protrude outward in the left-right direction, on rear end portions of the outer side surfaces of the support members 542. When the printer 1 performs printing in the peeling mode, the protruding portions 549 are engaged with the free end portion of the top wall portion 34 of the rear cover 3. The protruding portions 549 restrict the swinging movement of the peeling mechanism 5 in the closed state of the rear cover 3, and determine the position of the peeling mechanism 5 such that the upper surface of the top plate portion 521 is substantially horizontal.

In a position to the front of the separation member 541, the holding member 543 is disposed between sections of the pair of support members 542 that are to the front of the approximate center in the front-rear direction of each of the pair of support members 542. The holding member 543 has a top plate portion 551 and a rear plate portion 552. The top plate portion 551 has a thickness in the up-down direction, and is a plate shaped member that is disposed between upper side edge portions of front end portions of the pair of support members 542. The rear plate portion 552 has a thickness in the front-rear direction, and is a plate shaped member that extends downward from a rear side edge portion of the top plate portion 551 and that is disposed between the pair of support members 542. In the substantial center in the left-right direction of the rear plate portion 552, a cut out portion 553 (refer to FIG. 4) is formed that is cut out in a rectangular shape from the lower end side. A pair of boss portions 554 that protrude forward from the front surface of the rear plate portion 552 are respectively formed on the sides of both the left and right ends of the cut out portion 553. A holding portion 6 (refer to FIG. 5) that holds a detector 10 (refer to FIG. 6) is fixed to the position where the cut out portion 553 is formed, below the top plate portion 551 and in front of the rear plate portion 552. The holding portion 6 is fastened to the boss portions 554 using screws, and is fixed to the holding member 543.

The detector 10 is a reflection type photo sensor, for example. An opening portion 55 that penetrates in the up-down direction and extends long in the left-right direction is formed in a section of the separation portion 54 that is surrounded by the separation member 541, the pair of support members 542 and the holding member 543. In the peeling mode, the printer 1 temporarily places the heat-sensitive label peeled off from the base sheet on the first plate body 546 of the separation member 541 that faces the inside of the opening portion 55 of the separation portion 54. The holding portion 6 is provided in a position where the holding portion 6 faces the first plate body 546 from the front side. The detector 10 held by the holding portion 6 detects whether there is the heat-sensitive label on the first plate body 546, based on the intensity of reflected light obtained by light emitted into the opening portion 55 being reflected by the first plate body 546. The structure of the holding portion 6 will be explained in detail later.

The separation portion 54 can move in the front-rear direction with respect to the frame portion 52. A state in which the frame portion 54 has moved to the front of the frame portion 52 and the first plate body 546 of the separation member 541 is arranged below the top plate portion 521 (refer to FIG. 3) is referred to as a "housed state." A state in which the separation portion 54 has moved to the rear of the frame portion 52 and the separation member 541 is arranged to the rear of the top plate portion 521 (refer to FIG. 4) is referred to as a "protruding state." When the peeling mechanism 5 is in the protruding state, the printer 1 performs printing in the peeling mode, and when the peeling mechanism 5 is in the housed state, the printer 1 performs printing in the normal mode.

As shown in FIG. 5, a positioning member 525 is assembled to a front end portion of the peeling mechanism 5, on the lower surface side of the top plate portion 521 of the frame portion 52. The positioning member 525 performs positioning in response to a mode change of the peeling mechanism 5. Specifically, in the protruding state, a pair of spring members 526 that are fixed to the left and right sides of the positioning member 525 are engaged with protruding portions that protrude from inner surfaces of the support members 542 of the separation portion 54, and maintain the state in which the separation portion 54 protrudes from the frame portion 52. In the housed state, a pair of spring members 527 that are fixed to an intermediate portion in the left-right direction of the positioning member 525 are engaged with an edge portion on the lower end side of a wall portion on the rear end side of the holding member 543 of the separation portion 54, and maintain the state in which the separation portion 54 is housed in the frame portion 52. A pair of protruding portions 528 that are provided in the vicinity of the pair of spring members 527 and that protrude downward are engaged with spring members (not shown in the drawings) that are provided on the upper portion of the housing 2. When the shaft portions 523 provided on the side plate portions 522 of the frame portion 52 are guided by the bearing portions 264 (refer to FIG. 2) and the peeling mechanism 5 is moved to the rear of the housing 2, the protruding portions 528 are engaged with the spring members of the housing 2 and maintain that state.

Figure 6:
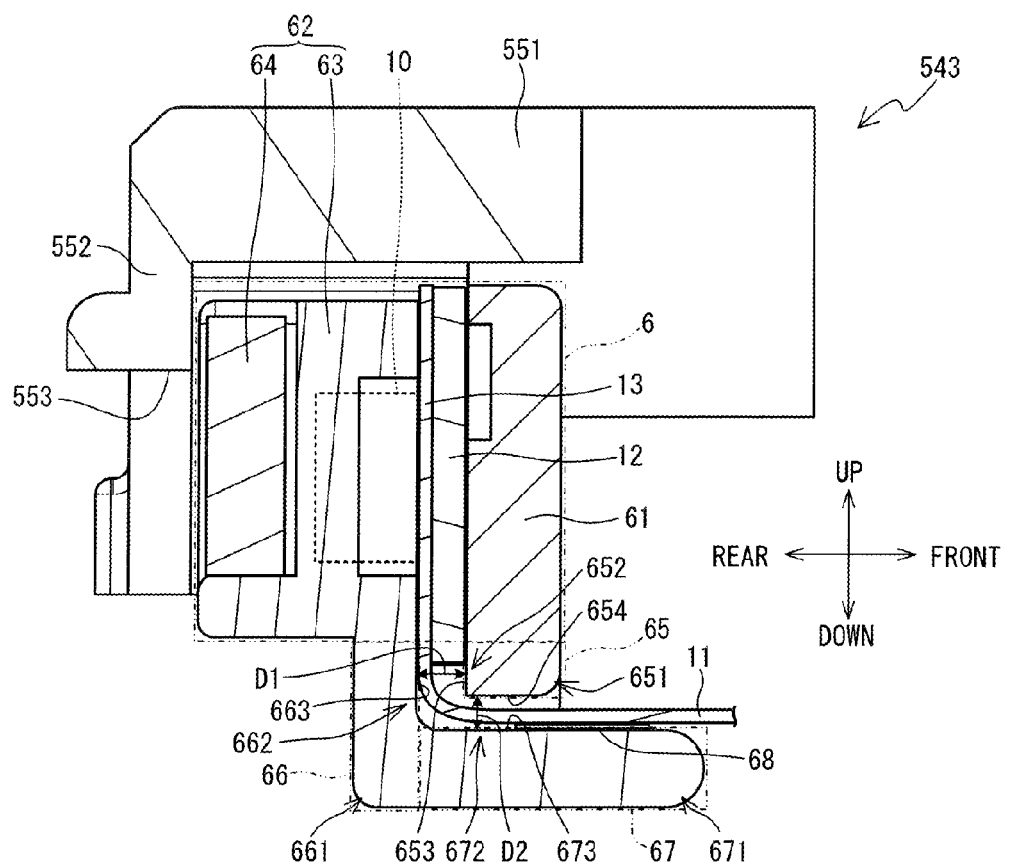
FIG. 6 is a cross-sectional view of a holding member 543 of the peeling mechanism 5, taken along a dotted line VI-VI shown in FIG. 5 when viewed upside down in the direction of arrows.

The structure of the holding portion 6 will be explained with reference to FIG. 5 and FIG. 6. As described above, the holding portion 6 is fixed to the position where the cut out portion 553 of the holding member 543 of the separation portion 54 is provided. The holding portion 6 clamps the detector 10 in the front-rear direction and holds the detector 10. The holding portion 6 is formed by a part of a first holding member 61 and a second holding member 62. The first holding member 61 has a thickness in the front-rear direction, and is a plate shaped member that extends in the left-right direction. An edge portion on the lower end side of the first holding member 61 is folded back to the rear, except a center portion in the left-right direction. The folded back portion is used for positioning of a board 12 that will be described later. The second holding member 62 is a box type member that covers the upper side, the lower side, the left side, the right side and the rear side of the detector 10. The second holding member 62 is formed by a transmission plate 64 and a peripheral wall portion 63. The transmission plate 64 is a plate shaped member that allows transmission of light, and forms a wall portion on the rear side of the second holding member 62. The peripheral wall portion 63 forms wall portions on the upper side, the lower side, the left side and the right side of the second holding member 62.

The detector 10 is electrically connected to the control board 8 via the FPC 11. The detector 10 is mounted on an end portion 13 on the detector 10 side of the FPC 11. The board 12 for reinforcement and for positioning the detector 10 with respect to the first holding member 61 is adhered to a surface of the end portion 13 of the FPC 11, the surface being on the opposite side to the side where the detector 10 is mounted. The end portion 13 of the FPC 11 and the board 12 are sandwiched between the rear surface of the first holding member 61 and the front surface of the peripheral wall portion 63 of the second holding member 62. In other words, the detector 10 is clamped and held in the front-rear direction by the second holding member 62 and a section of the first holding member 61 that faces the second holding member 62. In the present embodiment, the second holding member 62 and the section of the first holding member 61 that faces the second holding member 62 are defined as the holding portion 6. The FPC 11 is pulled out from below the holding portion 6.

A first wiring portion 65 and a second wiring portion 66 that extend downward are provided on an edge portion on the lower side of the holding portion 6. The first wiring portion 65 protrudes downward from the holding portion 6. In the present embodiment, the first wiring portion 65 is formed by a part of the plate shaped member that forms the first holding member 61. A lower end surface 654 that is directed downward is formed on a leading end portion 651 of the first wiring portion 65. A rear end surface 653 that is directed rearward is formed on the rear side of a side portion 652 between the leading end portion 651 and a base portion of the first wiring portion 65 (a root portion of the protruding first wiring portion 65). Similarly to the first wiring portion 65, the second wiring portion 66 protrudes downward from the holding portion 6. In the present embodiment, the second wiring portion 66 extends downward from an edge portion on the lower side of the second holding member 62, and is formed integrally with the second holding member 62. The second wiring portion 66 protrudes downward more than the first wiring portion 65. In other words, a leading end portion 661 of the second wiring portion 66 is positioned lower than the leading end portion 651 of the first wiring portion 65. A front end surface 663 that is directed forward is formed on the front side of a side portion 662 between the leading end portion 661 and a base portion of the second wiring portion 66 (a root portion of the protruding second wiring portion 66). The rear end surface 653 of the first wiring portion 65 and the front end surface 663 of the second wiring portion 66 face each other in the front-rear direction, and a first gap D1 is formed between them.

A third wiring portion 67 that extends forward is provided on the leading end portion 661 of the second wiring portion 66. The third wiring portion 67 is a portion that is configured to protrude forward from the leading end portion 661. In the present embodiment, the third wiring portion 67 is formed integrally with the second holding member 62, together with the second wiring portion 66. A leading end portion 671 of the third wiring portion 67 protrudes at least further to the front than the position of the rear end surface 653 of the first wiring portion 65. The leading end portion 671 of the third wiring portion 67 is formed in an arc shape that bulges forward in a side view. An upper end surface 673 that is directed upward is formed on the upper side of a side portion 672 between the leading end portion 671 and a base portion of the third wiring portion 67 (a root portion of the protruding third wiring portion 67). The lower end surface 654 of the first wiring portion 65 and the upper end surface 673 of the third wiring portion 67 face each other in the up-down direction, and a second gap D2 is formed between them.

Two hole portions 69 (refer to FIG. 5) that penetrate in the thickness direction are formed on both left and right end portions of the first holding member 61. The holding portion 6 is fixed to the holding member 543 in a state in which the transmission plate 64 of the second holding member 62 is directed toward the cutout portion 553. Specifically, screws that are inserted through the hole portions 69 of the first holding member 61 are fastened to the boss portions 554 of the rear plate portion 552, and thus the holding portion 6 is fixed to the holding member 543. The FPC 11 that has been pulled out from the holding portion 6 passes through the first gap D1 and the second gap D2, and is pulled out to the outside of the peeling mechanism 5 in the forward direction. In other words, since the FPC 11 is wired through the first gap D1 and the second gap D2, the peeling mechanism 5 guides the direction in which the FPC 11 is pulled out to the outside. The FPC 11 is fixed to the upper end surface 673 of the third wiring portion 67 using an adhesive 68.

Next, an overview when printing is performed on the heat-sensitive label in the normal mode will be explained. In the normal mode, the peeling mechanism 5 is in the housed state, and is held by the housing 2 in a state in which the peeling mechanism 5 has swung such that the upper surface of the top plate portion 521 is substantially horizontal (refer to FIG. 2). Therefore, the separation portion 54 of the peeling mechanism 5 is positioned to the front of the discharge port 15. When the lever 23 of the housing 2 moves downward in response to an operation, the hooks 27 swing and the engagement with the support cylinders 33 that support the platen roller 32 is released. The free end portion of the rear cover 3 swings upward due to the urging force of the urging member 31 (refer to FIG. 2), and the tape housing portion 24 is opened.

Figure 7:
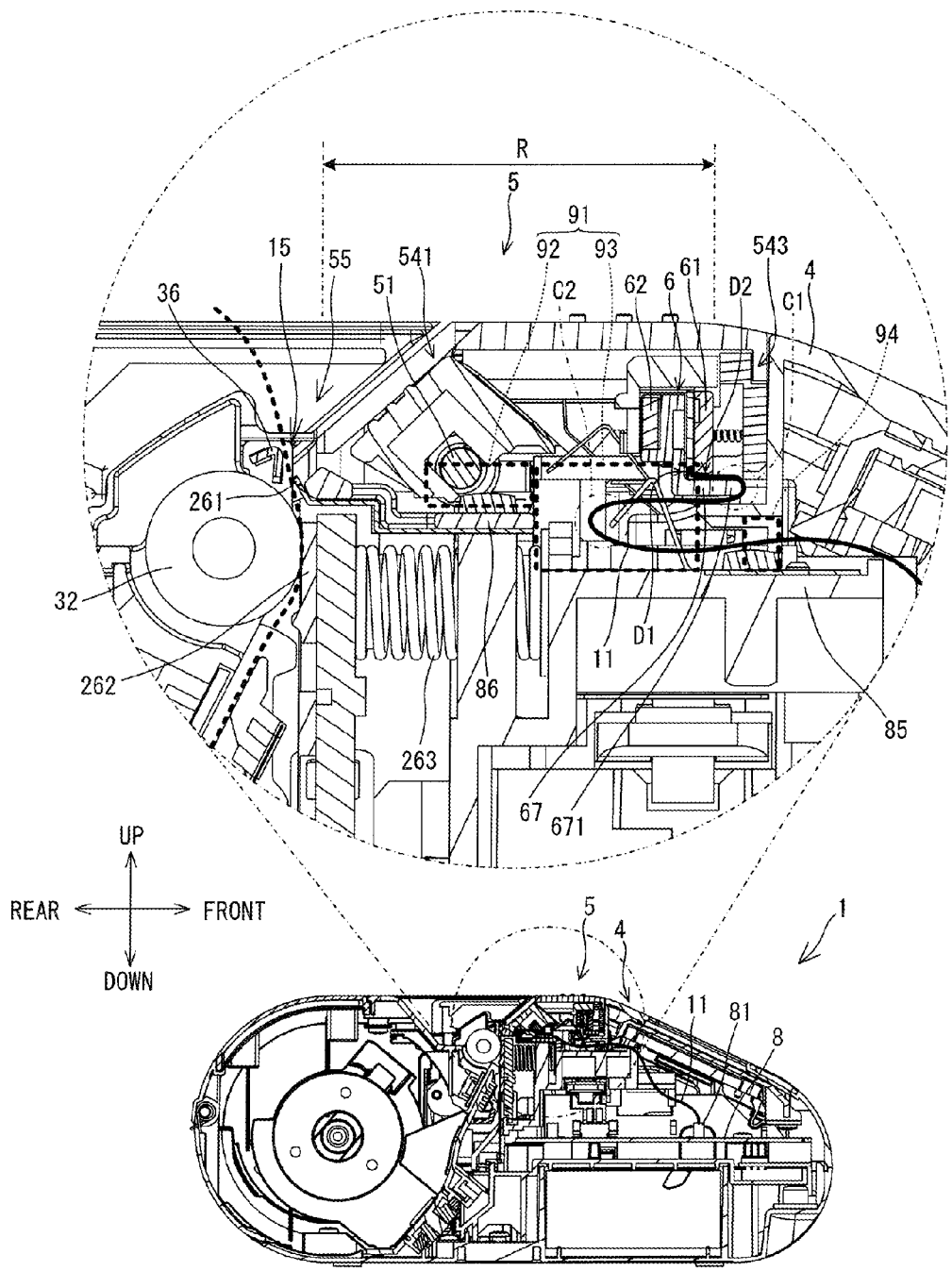
FIG. 7 is a cross-sectional view of the printer 1 when the peeling mechanism 5 is in the housed state, taken along a dotted line VII-VII shown in FIG. 1 when viewed in the direction of arrows.

The label tape is mounted on the holder 9, and the rear cover 3 is closed in a state in which the leading edge of the label tape is caused to extend higher than the cutting portion 261. The hooks 27 are engaged with the support cylinders 33 and the platen roller 32 is positioned with respect to the printing portion 262 of the housing 2. As shown in FIG. 7, the label tape (shown by a dotted line in FIG. 7) is in a state in which it is inserted from the lower side to the upper side between the printing portion 262 and the platen roller 32. The printing portion 262 is pushed by the urging member 263 and presses the label tape against the platen roller 32 with a predetermined force.

Figure 2:
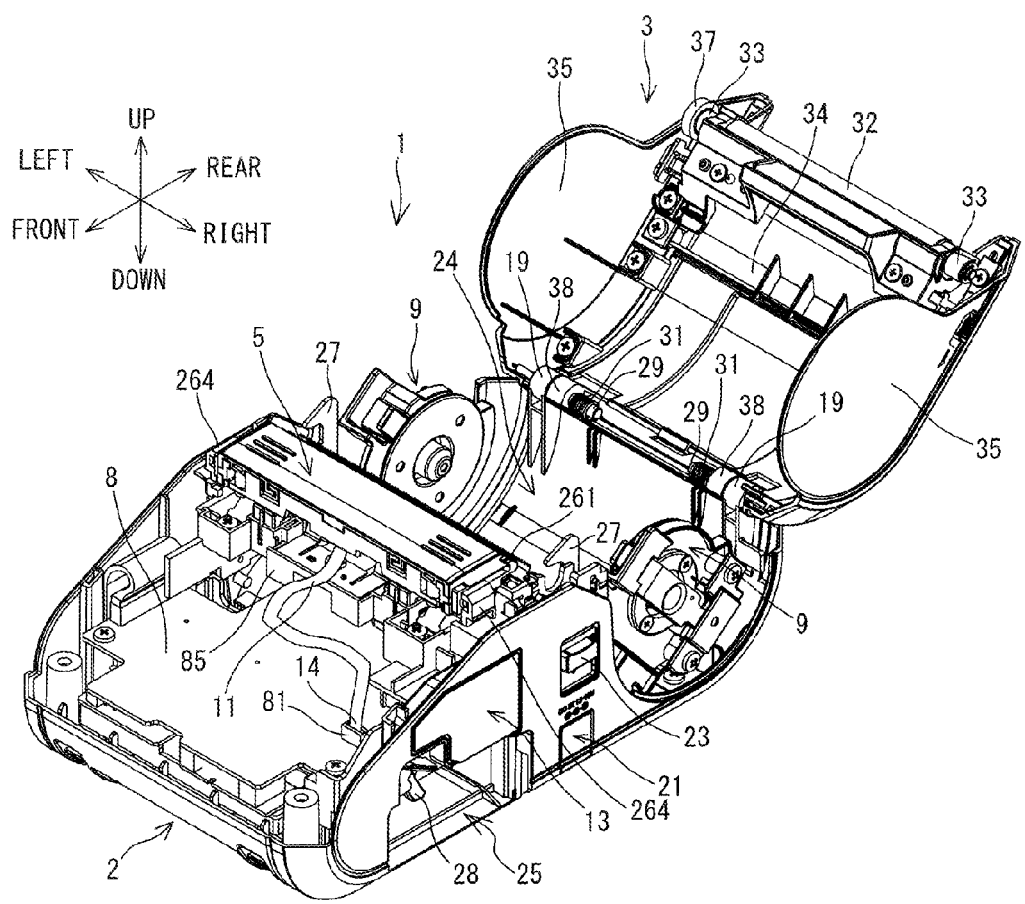
FIG. 2 is a perspective view of the printer 1 when the rear cover 3 is opened and a front cover 4 is removed.

When the CPU (not shown in the drawings) of the control board 8 receives print data, the CPU controls the drive of the drive portion (not shown in the drawings) and causes the platen roller 32 to rotate via the gear 37 (refer to FIG. 2). The label tape sandwiched between the platen roller 32 and the printing portion 262 is sequentially fed out, and is fed from the lower side to the upper side. At the same time, the CPU controls the drive of a heating element of the printing portion 262 and causes the heating element to generate heat in accordance with the print data. Thus, characters and graphics are printed on the heat-sensitive label. After the printing, the label tape is discharged from the discharge port 15 to the outside of the printer 1 in the state in which the heat-sensitive label is adhered to the base sheet. The discharged label tape is cut by the cutting portion 261.

Note that, in the peeling mode, the printer 1 can also use the peeling mechanism 5 to peel off, from the base sheet, the heat-sensitive label that adheres to the base sheet of the label tape discharged from the discharge port 15. The procedure when the printer 1 is caused to operate in the peeling mode will be explained below. The procedure until the rear cover 3 is opened is the same as that in the normal mode, and an explanation thereof is thus omitted.

Figure 8:
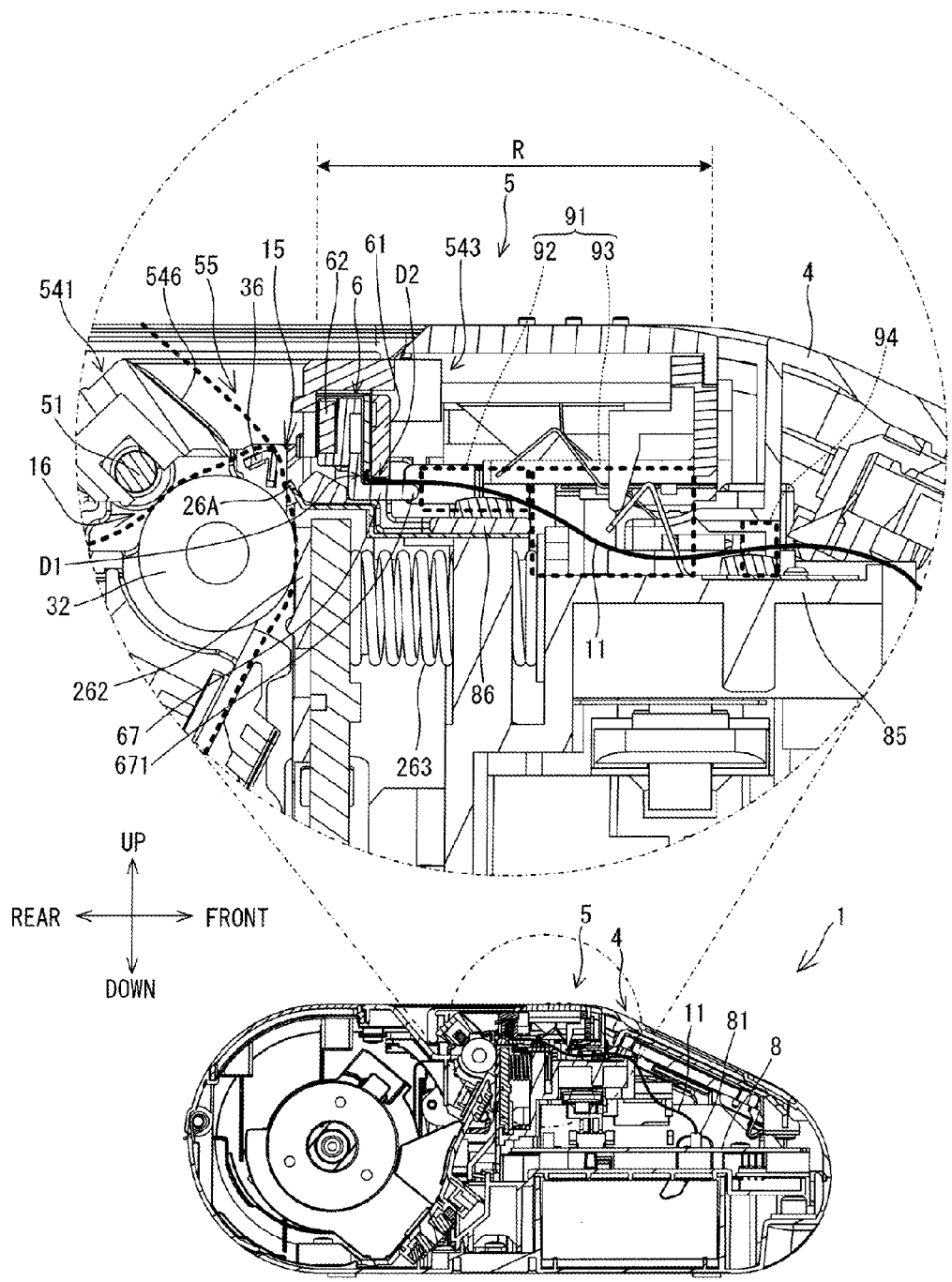
FIG. 8 is a cross-sectional view of the printer 1 when the peeling mechanism 5 shown in FIG. 7 is in the protruding state.

As shown in FIG. 8, in the peeling mode, the state of the peeling mechanism 5 is changed from the housed state to the protruding state. When the shaft portion 523 is guided by the bearing portions 264 (refer to FIG. 2) of the housing 2 and moves rearward with respect to the housing 2, the peeling mechanism 5 is urged by the spring members (not shown in the drawings) provided on the upper portion of the housing 2 and swings around the shaft portion 523. As a result, the rear end side of the peeling mechanism 5 moves upward. In this state, the separation portion 54 housed in the frame portion 52 is pulled out to the rear, and the peeling mechanism 5 is in the protruding state. The label tape is mounted on the holder 9 and the rear cover 3 is closed in a state in which the leading edge of the label tape is caused to extend higher than the cutting portion 261. Note that it is assumed that the heat-sensitive label is not adhered to the leading edge of the label tape.

In the process in which the rear cover 3 is closed, the protruding portions 549 (refer to FIG. 4) that are provided on a rear end portion of the separation portion 54 come into contact with the free end portion of the rear cover 3. The rear cover 3 depresses the protruding portions 549 and swings the peeling mechanism 5. In a state in which the rear cover 3 is closed, sections of the free end portion of the rear cover 3 that depress the protruding portions 549 are provided higher than the position of the rotating shaft of the platen roller 32. Therefore, in the process in which the rear cover 3 is closed, the feed rollers 51 of the separation portion 54 of the peeling mechanism 5 are arranged to be higher than the platen roller 32. The peeling mechanism 5 holds down the label tape on the lower surface side of the peeling mechanism 5, and clamps the leading edge of the label tape at a contact section 16 between the surface of each of the feed rollers 51 and the surface of the platen roller 32. When the rear cover 3 is closed and the hooks 27 are engaged with the support cylinders 33, the platen roller 32 is positioned with respect to the printing portion 262 of the housing 2. The peeling mechanism 5 is in a state in which the upper surface of the top plate portion 521 is substantially horizontal.

The label tape (shown by a dotted line in FIG. 7) is inserted from the lower side to the upper side between the printing portion 262 and the platen roller 32. Further, the label tape is bent rearward at an acute angle by the separation plate 36 and is guided to the contact section 16 between each of the feed rollers 51 and the platen roller 32. The printing portion 262 is pushed by the urging member 263 and presses the label tape against the platen roller 32 with a predetermined force. Each of the feed rollers 51 is also pressed by an urging member (not shown in the drawings) that is provided on the separation member 541, and presses the label tape against the platen roller 32 with a predetermined force.

The CPU of the control board 8 controls the drive portion based on the print data, and causes the platen roller 32 to rotate. The label tape sandwiched between the platen roller 32 and the printing portion 262 is sequentially fed out, and is fed from the lower side to the upper side. Then, the label tape is discharged from the discharge port 15. At the same time, the CPU controls the printing portion 262 and performs printing on the heat-sensitive label based on the print data. The label tape discharged from the discharge port 15 is drawn to the contact section 16 between each of the feed rollers 51 and the platen roller 32. The label tape is bent at an acute angle by the separation plate 36, on a feed path of the label tape toward the contact section 16. Therefore, the printed heat-sensitive label adhered to the base sheet is peeled off from the base sheet. The peeled-off heat-sensitive label does not move toward the contact section 16, and is fed in the direction in which the label tape was fed before it was bent by the separation plate 36, namely, in the direction toward the opening portion 55 of the separation portion 54. The heat-sensitive label that has been completely peeled off from the base sheet is arranged on the first plate body 546 of the separation member 541 that faces the inside of the opening portion 55 of the separation portion 54, and is temporarily fixed by an adhesive on the back surface of the label. The CPU feeds the label tape by a predetermined length, arranges the next heat-sensitive label in a printing start position, and stops the rotation of the platen roller 32. When, based on a detection result by the detector 10, it is detected that the heat-sensitive label on the first plate body 546 has been removed, the CPU controls the drive portion based on the print data and starts to perform printing on the next heat-sensitive label.

The path, through which the FPC 11 pulled out from the peeling mechanism 5 passes inside the printer 1, will be explained with reference to FIG. 7 and FIG. 8. Since the state of the peeling mechanism 5 can be changed between the housed state and the protruding state, the position of the holding portion 6 that holds the detector 10 moves in the front-rear direction with respect to the housing 2. Therefore, in accordance with the movement of the position of the holding portion 6, the FPC 11 connected to the detector 10 is bent or stretched in a movement range R within which the holding portion 6 can move in the front-rear direction.

As shown in FIG. 2, a base portion 85 is arranged below the peeling mechanism 5 inside the housing 2. The bearing portions 264 that support the peeling mechanism 5 are provided on both the left and right ends of the base portion 85. The base portion 85 is arranged below the peeling mechanism 5 such that there is a gap between the base portion 85 and the peeling mechanism 5. A front end portion of the base portion 85 is positioned to the front of the arrangement position of the peeling mechanism 5. The base portion 85 is arranged above the control board 8 such that there is a gap between the base portion 85 and the control board 8. The connector 81 of the control board 8, to which the end portion 14 of the FPC 11 is connected, is provided to the front of and below the base portion 85. Therefore, the FPC 11 pulled out from the peeling mechanism 5 passes through a wiring path 91 (refer to FIG. 7) and a gap 94 (refer to FIG. 7), and is wired toward the connector 81. The wiring path 91 is the gap between the peeling mechanism 5 and the base portion 85. The gap 94 is a gap between the base portion 85 and a free end portion of the front cover 4. The gap 94 is positioned below the position where the detector 10 is arranged inside the housing 2. Therefore, the FPC 11 passes through a position in the wiring path 91 that is lower than the position of the upper end surface 673 of the third wiring portion 67 in the up-down direction.

As shown in FIG. 8, the urging member 263 and a partition plate 86 are provided on a rear end portion of the base portion 85. The urging member 263 urges the printing portion 262 rearward. The partition plate 86 inhibits the contact between the base portion 85 and the FPC 11. Since the urging member 263 and the partition plate 86 are provided on the rear end portion of the base portion 85, an upper surface of the rear end portion of the base portion 85 is stepped higher than an upper surface of a front end portion of the base portion 85. That is, the wiring path 91 includes two wiring paths 92 and 93, for which the size of the gap (through which the FPC 11 passes) between the peeling mechanism 5 and the base portion 85 is different in the up-down direction. The wiring path 92 is a path through which the FPC 11 passes between the peeling mechanism 5 and a section of the base portion 85 on which the partition plate 86 is provided. The wiring path 93 is a path through which the FPC 11 passes between the peeling mechanism 5 and a section of the base portion 85 on which the partition plate 86 is not provided. The size of the wiring path 92 in the up-down direction is smaller than the size of the wiring path 93 on the front side in the up-down direction.

When the state of the peeling mechanism 5 is changed to the protruding state, the holding portion 6 moves rearward within the movement range R. The holding portion 6 is positioned at the rearmost end of the movement range R, and is separated from the gap 94 in the front-rear direction. Therefore, the FPC 11 is stretched in the wiring path 91. In the stretched state, the FPC 11 passes through the wiring path 92 with a small gap in the up-down direction and the wiring path 93 with a large gap in the up-down direction, and moves toward the gap 94 that connects to the control board 8. The peeling mechanism 5 causes the FPC 11, which has been pulled out from the holding portion 6, to pass through the first gap D1 and the second gap D2 and wires the FPC 11 from the second gap D2 to the front. Thus, the FPC 11 is wired such that the direction in which the FPC 11 is stretched is directed in the direction in which it passes, even in the wiring path 92 that has the small gap in the up-down direction. As a result, the FPC 11 is wired without a load being applied to it as a result of being forcibly bent.

As shown in FIG. 7, when the state of the peeling mechanism 5 is changed to the housed state, the holding portion 6 moves forward within the movement range R. The holding portion 6 is positioned at the forefront end of the movement range R and approaches the gap 94 in the front-rear direction. Therefore, the FPC 11 is bent in the wiring path 91. As described above, the FPC 11 is wired from the second gap D2 to the front, and is positioned below the upper end surface 673 of the third wiring portion 67. Therefore, in the process in which the holding portion 6 moves forward, the leading end portion 671 of the third wiring portion 67 comes into contact with the FPC 11 that is positioned to the front of the second gap D2. When the FPC 11 is caused to extend along the surface of the leading end portion 671, the leading end portion 671, which is formed in an arc shape that bulges forward in a side view, is bent such that it is folded back from the front side to the rear side. More specifically, a first bent portion C1 that protrudes forward is formed in the FPC 11 by the leading end portion 671. In other words, at the first bent portion C1, the FPC 11 is bent such that a surface that is directed upward when the FPC 11 is stretched (refer to FIG. 8) is on the outer surface side. Further, since the FPC 11 is fixed to the upper end surface 673 of the third wiring portion 67 by the adhesive 68, it is easy for the peeling mechanism 5 to cause the FPC 11 to extend along the surface of the leading end portion 671 when the first bent portion C1 is formed.

The gap 94 that connects to the control board 8 is positioned to the front of the movement range R. Therefore, the FPC 11 is bent such that a section of the FPC 11 that is closer to the end portion 14 (refer to FIG. 2) than the section folded back at the first bent portion C1 is folded back from the rear side to the front side. That is, a second bent portion C2 that protrudes rearward is formed on the section of the FPC 11 that is closer to the end portion 14 than the section folded back at the first bent portion C1. At the second bent portion C2, the FPC 11 is bent such that the surface that is directed upward when the FPC 11 is stretched (refer to FIG. 8) is on the inner surface side.

In this manner, even when the state of the peeling mechanism 5 is changed between the protruding state and the housed state, the section of the FPC 11 in which the first bent portion C1 is formed is bent such that the surface that is directed upward when the FPC 11 is stretched is reliably on the outer surface side and is not on the inner surface side. In a similar manner, the section of the FPC 11 in which the second bent portion C2 is formed is bent such that the surface that is directed upward when the FPC 11 is stretched is reliably on the inner surface side and is not on the outer surface side. In other words, when the state of the peeling mechanism 5 is changed between the protruding state and the housed state, the peeling mechanism 5 can restrict the direction in which the FPC 11 is bent to the direction in which one of the surfaces is constantly the inner surface. Thus, the peeling mechanism 5 having the structure of the present disclosure can suppress disconnection etc. that could occur when a wiring member in the FPC 11 is repeatedly bent and fatigue is accumulated. The printer 1 can use the peeling mechanism 5 to bend the FPC 11 smoothly, and it is thus possible to have a section with a small gap in the up-down direction, such as the wiring path 92. Therefore, the printer 1 can utilize the space obtained by reducing the size of the wiring path 92, to arrange another structural component. It is thus possible to achieve reduction in space for the arrangement of structural components and to increase the degree of freedom in layout.

As described above, the FPC 11 that is pulled out from the holding portion 6 and is wired passing through the first gap D1 and the second gap D2 extends forward in the front-rear direction. When the holding portion 6 has moved to a front side position in the front-rear direction, the FPC 11 has two or more bent portions. When the holding portion 6 has moved to a rear side position in the front-rear direction, the first bent portion C1 and the second bent portion C2 do not bend in an opposite direction because their bending is simply stretched. In other words, the outer side surfaces of the first bent portion C1 and the second bent portion C2 when they are bent do not become the inner side surfaces when they are stretched. Therefore, in the FPC 11, the bent direction is constantly the same direction at any of the bent portions, and it is sufficient to simply perform the bending and stretching when the holding portion 6 moves. It is thus possible to suppress disconnection of the FPC 11.

The first holding member 61 can be formed integrally with the first wiring portion 65, and the second holding member 62 can be formed integrally with the second wiring portion 66. It is thus possible to simplify the structure of the holding portion 6.

At least a part of the FPC 11 is positioned below the upper end surface 673 in the up-down direction. As a result, when the holding portion 6 moves forward in the front-rear direction, the leading end portion 671 of the third wiring portion 67 reliably comes into contact with the FPC 11. Therefore, the first bent portion C1 can be formed.

When the holding portion 6 has moved rearward in the front-rear direction, the bent portions of the FPC 11 are stretched. Therefore, even when the wiring path 92 positioned on the rear side in the front-rear direction of the wiring path 91 is configured to be smaller than the wiring path 93 positioned on the front side, a load is not applied to the FPC 11. Therefore, in the rear side section of the wiring path 91 in the front-rear direction, a space can be utilized for another structural component of the device, and it is possible to increase the degree of freedom in the layout of the device structure.

By fixing the FPC 11 to the upper end surface 673, the positioning of the FPC 11 in the second gap D2 can be performed reliably. Thus, when the holding portion 6 moves forward in the front-rear direction, the leading end portion 671 of the third wiring portion 67 can easily come into contact with the FPC 11, and it is possible to more reliably form the first bent portion C1.

The FPC 11 is simply bent and stretched when the holding portion 6 moves, and in comparison to a case in which the bending is repeated on one surface side and the other surface side, disconnection is less likely to occur. Therefore, the wiring thickness can be made thin, and even when a flexible printed circuit board that can be easily routed is used, disconnection is unlikely to occur. It is therefore possible to achieve a size reduction of the device structure.

Since the detector 10 is provided on the FPC 11, the detector 10 can be held by the holding portion 6, together with the FPC 11. Therefore, when the holding portion 6 moves, a load is unlikely to be applied to the connection portion between the detector 10 and the FPC 11.

The frame portion 52 guides the movement of the separation portion 54, and changes the position of the holding portion 6 and of the feed rollers 51 between the housed state and the protruding state. Thus, the frame portion 52 can switch between a case in which the heat-sensitive label is peeled off from the base sheet and a case in which the heat-sensitive label is not peeled off. For example, when a photo sensor, an ultrasonic wave sensor or the like is used as the detector 10 so that it is possible to detect whether there is the peeled-off heat-sensitive label, if the peeling mechanism 5 is configured to make it possible to move the detector 10 held by the holding portion 6, it is possible to suppress disconnection etc. of the FPC 11 that is connected to the detector 10. It is therefore possible to improve reliability of operation.

Note that the present disclosure is not limited to the above-described embodiment, and various changes are possible. In the above-described embodiment, the reflection type photo sensor is used as the detector 10. However, for example, a transmission type photo sensor may be used. In this case, for example, the photo sensor may make the detection when a detection piece that protrudes into the opening portion 55 is pressed by the heat-sensitive label. Another sensor, such as an ultrasonic wave sensor or the like, may be used as the detector 10. In the above-described embodiment, the FPC 11 is used to connect the detector 10 and the control board 8. However, for example, a flexible flat cable (FFC) may be used.

In the above-described embodiment, when the state of the peeling mechanism 5 is changed to the housed state, the two bent portions, i.e., the first bent portion C1 and the second bent portion C2, are formed in the FPC 11. However, three or more bent portions may be formed in the FPC 11. In the above-described embodiment, the leading end portion 671 of the third wiring portion 67 protrudes further to the front than the first wiring portion 65. However, the leading end portion 671 need not necessarily protrude further to the front than the first wiring portion 65. It is sufficient if the leading end portion 671 of the third wiring portion 67 at least protrudes further to the front than the rear end surface 653 and the second gap D2 can be formed.

In the above-described embodiment, the first wiring portion 65 is a part of the plate shaped member that forms the first holding member 61. However, the first wiring portion 65 may be a portion that separately protrudes from the plate shaped member. Alternatively, the first wiring portion 65 may be formed as a separate body from the first holding member 61 and may be assembled to the first holding member 61. In a similar manner, the second wiring portion 66 may be formed as a separate body from the second holding member 62 and may be assembled to the second holding member 62.

In the above-described embodiment, the detector 10 is provided such that it is mounted on the end portion 13 of the FPC 11. However, the detector 10 need not necessarily be mounted on the FPC 11, and the FPC 11 may be connected to a terminal portion. The board 12 that reinforces the end portion 13 of the FPC 11 need not necessarily be provided. In the above-described embodiment, the holding portion 6 holds the detector 10 such that the first holding member 61 and the second holding member 62 clamp the detector 10. However, instead of clamping and holding the detector 10, another method, such as screwing or bonding, for example, may be used to hold the detector 10.

What is claimed is:

1. An electronic component moving mechanism comprising:
   an electronic component;
   a holding portion that is configured to hold the electronic component;
   a position changing portion that is configured to guide movement of the holding portion and to change a position of the holding portion at least in a predetermined first direction;
   a first wiring portion that is provided on an edge portion of the holding portion on one side in a second direction that intersects the first direction, and that protrudes from the edge portion toward the one side in the second direction, the first wiring portion having a first surface on a side portion and having a second surface on a leading end portion, the first surface intersecting the first direction, and the second surface intersecting the second direction;
   a second wiring portion that is provided in a position further to one side in the first direction than a position where the first wiring portion is provided on the edge portion, and that protrudes from the edge portion toward the one side in the second direction, the second wiring portion having a leading end portion that is positioned further to the one side in the second direction than the leading end portion of the first wiring portion, the second wiring portion having a third surface on a side portion, and the third surface facing the first surface such that a first gap is formed between the third surface and the first surface;
   a third wiring portion that protrudes from the leading end portion of the second wiring portion toward another side in the first direction, and that has a leading end portion that is positioned further to the other side in the first direction than the first surface, the third wiring portion having a fourth surface on a side portion, and the fourth surface facing the second surface such that a second gap is formed between the fourth surface and the second surface; and
   a connection line that has a first end portion that is connected to the electronic component, and that is wired passing through the first gap and the second gap, the connection line having a second end portion that is connected to an external circuit in a position further to the other side in the first direction than a change range within which the position changing portion is capable of changing the position of the holding portion in the first direction, and that includes at least two bent portions that include a first bent portion and a second bent portion in a case where the position of the holding portion is changed to a position on the other side in the first direction, the first bent portion being folded back from the other side to the one side in the first direction along the leading end portion of the third wiring portion, and the second bent portion being folded back from the one side to the other side in the first direction between the first bent portion and the second end portion.

2. The electronic component moving mechanism according to claim 1, wherein
the holding portion includes a first extending portion and a second extending portion, the first extending portion being integrally connected to the first wiring portion on the edge portion and extending toward another side in the second direction, and the second extending portion being integrally connected to the second wiring portion on the edge portion and extending toward the other side in the second direction, and the holding portion holds the electronic component by clamping the electronic component between the first extending portion and the second extending portion.

3. The electronic component moving mechanism according to claim 1, wherein
the connection line is wired such that at least a part of a section that is closer to the second end portion than the second gap passes through a position that is further to the one side in the second direction than the fourth surface, in a wiring path that is a path where the connection line is wired between the holding portion and the external circuit.

4. The electronic component moving mechanism according to claim 3, wherein
a size in the second direction of a section of the wiring path that is on the one side in the first direction is smaller than a size in the second direction of a section of the wiring path that is on the other side in the first direction.

5. The electronic component moving mechanism according to claim 1, wherein
the connection line is fixed to the fourth surface.

6. The electronic component moving mechanism according to claim 1, wherein
the connection line is a flexible printed circuit board.

7. The electronic component moving mechanism according to claim 6, wherein
the electronic component is provided on the connection line, at the first end portion.

8. A printer comprising:
a printing portion that is configured to perform printing on a label;
a lid portion that is configured to be capable of opening and closing a housing portion that houses a roll, around which a base sheet to which the label is adhered is wound;
a first roller that is provided on the lid portion and that is configured to rotate around a rotating shaft that extends in a third direction that intersects a first direction and a second direction, the second direction intersecting the first direction;
an electronic component moving mechanism that includes an electronic component,
a holding portion that is configured to hold the electronic component and to be movable at least in the first direction,
a second roller that is provided further to one side in the first direction than the holding portion, and movement of which is guided together with the holding portion, the second roller being configured to rotate around a rotating shaft that extends in the third direction, and being configured to feed the base sheet such that the base sheet is clamped between the first roller and the second roller,
a position changing portion that is configured to guide the movement of the holding portion and the second roller, and that is configured to change the position of the holding portion and of the second roller between a first position and a second position, the first position being a position where the holding portion and the second roller have been moved to another side in the first direction, and being a position where the second roller is separated from the first roller, and the second position being a position where the holding portion and the second roller have been moved to the one side in the first direction, and being a position where the second roller comes into contact with the first roller,
a first wiring portion that is provided on an edge portion of the holding portion on one side in the second direction, and that protrudes from the edge portion toward the one side in the second direction, the first wiring portion having a first surface on a side portion and having a second surface on a leading end portion, the first surface intersecting the first direction, and the second surface intersecting the second direction,
a second wiring portion that is provided in a position further to the one side in the first direction than a position where the first wiring portion is provided on the edge portion, and that protrudes from the edge portion toward the one side in the second direction, the second wiring portion having a leading end portion that is positioned further to the one side in the second direction than the leading end portion of the first wiring portion, and the second wiring portion having a third surface on a side portion, the third surface facing the first surface such that a first gap is formed between the third surface and the first surface,
a third wiring portion that protrudes from the leading end portion of the second wiring portion toward the other side in the first direction, and that has a leading end portion that is positioned further to the other side in the first direction than the first surface, the third wiring portion having a fourth surface on a side portion, the fourth surface facing the second surface such that a second gap is formed between the fourth surface and the second surface, and
a connection line that has a first end portion that is connected to the electronic component, that is wired passing through the first gap and the second gap, the connection line having a second end portion that is connected to an external circuit in a position further to the other side in the first direction than a change range within which the position changing portion is capable of changing the position of the holding portion in the first direction, and that includes at least two bent portions that include a first bent portion and a second bent portion in a case where the position of the holding portion is changed to a position on the other side in the first direction, the first bent portion being folded back from the other side to the one side in the first direction along the leading end portion of the third wiring portion, and the second bent portion being folded back from the one side to the other side in the first direction between the first bent portion and the second end portion; and a peeling portion that is disposed between the second roller and the holding portion, and that is configured to be capable of peeling off the label from the base sheet when the first roller and the second roller feed the base sheet.

\* \* \* \* \*